(12) United States Patent
Matsuo et al.

(10) Patent No.: US 10,377,135 B2
(45) Date of Patent: Aug. 13, 2019

(54) ELECTRONIC DEVICE, LIQUID EJECTION HEAD, AND METHOD OF MANUFACTURING ELECTRONIC DEVICE

(71) Applicant: Seiko Epson Corporation, Tokyo (JP)

(72) Inventors: Yasuhide Matsuo, Suwa (JP); Kenji Otsuka, Suwa (JP); Hiroyuki Tsuchiya, Suwa (JP); Kei Tadachi, Suwa (JP); Wataru Takahashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/735,884

(22) PCT Filed: Jul. 1, 2016

(86) PCT No.: PCT/JP2016/003154
§ 371 (c)(1),
(2) Date: Dec. 12, 2017

(87) PCT Pub. No.: WO2017/017899
PCT Pub. Date: Feb. 2, 2017

(65) Prior Publication Data
US 2019/0001681 A1    Jan. 3, 2019

(30) Foreign Application Priority Data
Jul. 28, 2015 (JP) .................. 2015-148372

(51) Int. Cl.
*B41J 2/14* (2006.01)
*B41J 2/16* (2006.01)
*H01L 41/047* (2006.01)
*H01L 41/187* (2006.01)

(52) U.S. Cl.
CPC ....... *B41J 2/14209* (2013.01); *B41J 2/14233* (2013.01); *B41J 2/161* (2013.01); *B41J 2/1607* (2013.01); *B41J 2/1623* (2013.01); *B41J 2002/14241* (2013.01); *B41J 2002/14362* (2013.01); *H01L 41/0472* (2013.01); *H01L 41/1876* (2013.01)

(58) Field of Classification Search
None
See application file for complete search history.

(56) References Cited

U.S. PATENT DOCUMENTS

| 6,358,354 B1 | 3/2002 | Patil |
| 7,695,114 B2 | 4/2010 | Koda et al. |
| 7,922,860 B2 | 4/2011 | Yoshizawa et al. |

(Continued)

FOREIGN PATENT DOCUMENTS

| JP | H03247686 A | 11/1991 |
| JP | H09174861 A | 7/1997 |

(Continued)

*Primary Examiner* — Erica S Lin
(74) *Attorney, Agent, or Firm* — Workman Nydegger

(57) ABSTRACT

An electronic device includes a joined-structure assembly in which a plurality of structures are joined together. At least one of the plurality of structures includes a movable region, a part of an adhesive agent applied between the structures faces a space communicating with the movable region, and the adhesive agent includes an organo-siloxane compound with three or more reaction points.

15 Claims, 7 Drawing Sheets

(56) References Cited

U.S. PATENT DOCUMENTS

| | | | |
|---|---|---|---|
| 9,475,969 B2* | 10/2016 | Sakamoto | C09D 183/14 |
| 2003/0063137 A1 | 4/2003 | Kamei et al. | |
| 2006/0207720 A1 | 9/2006 | Yoshizawa et al. | |
| 2008/0308828 A1* | 12/2008 | Kashiwagi | C08L 83/04 |
| | | | 257/98 |
| 2009/0115818 A1* | 5/2009 | Matsuo | B41J 2/14274 |
| | | | 347/47 |
| 2010/0243145 A1 | 9/2010 | Imamura et al. | |
| 2010/0302312 A1 | 12/2010 | Yamamoto et al. | |

FOREIGN PATENT DOCUMENTS

| | | |
|---|---|---|
| JP | 2004099751 A | 4/2004 |
| JP | 2006-175654 | 7/2006 |
| JP | 2006-291167 | 10/2006 |
| JP | 2006-315307 | 11/2006 |
| JP | 2007-009189 | 1/2007 |
| JP | 2007-216633 | 8/2007 |
| JP | 2009-298912 | 12/2009 |
| JP | 2010-229272 | 10/2010 |
| JP | 2010-274523 | 12/2010 |
| JP | 2011-129591 | 6/2011 |
| WO | 2009/111196 | 9/2009 |
| WO | WO-2014097573 A1 * | 6/2014 ........... C09D 183/14 |

* cited by examiner

[Fig. 1]
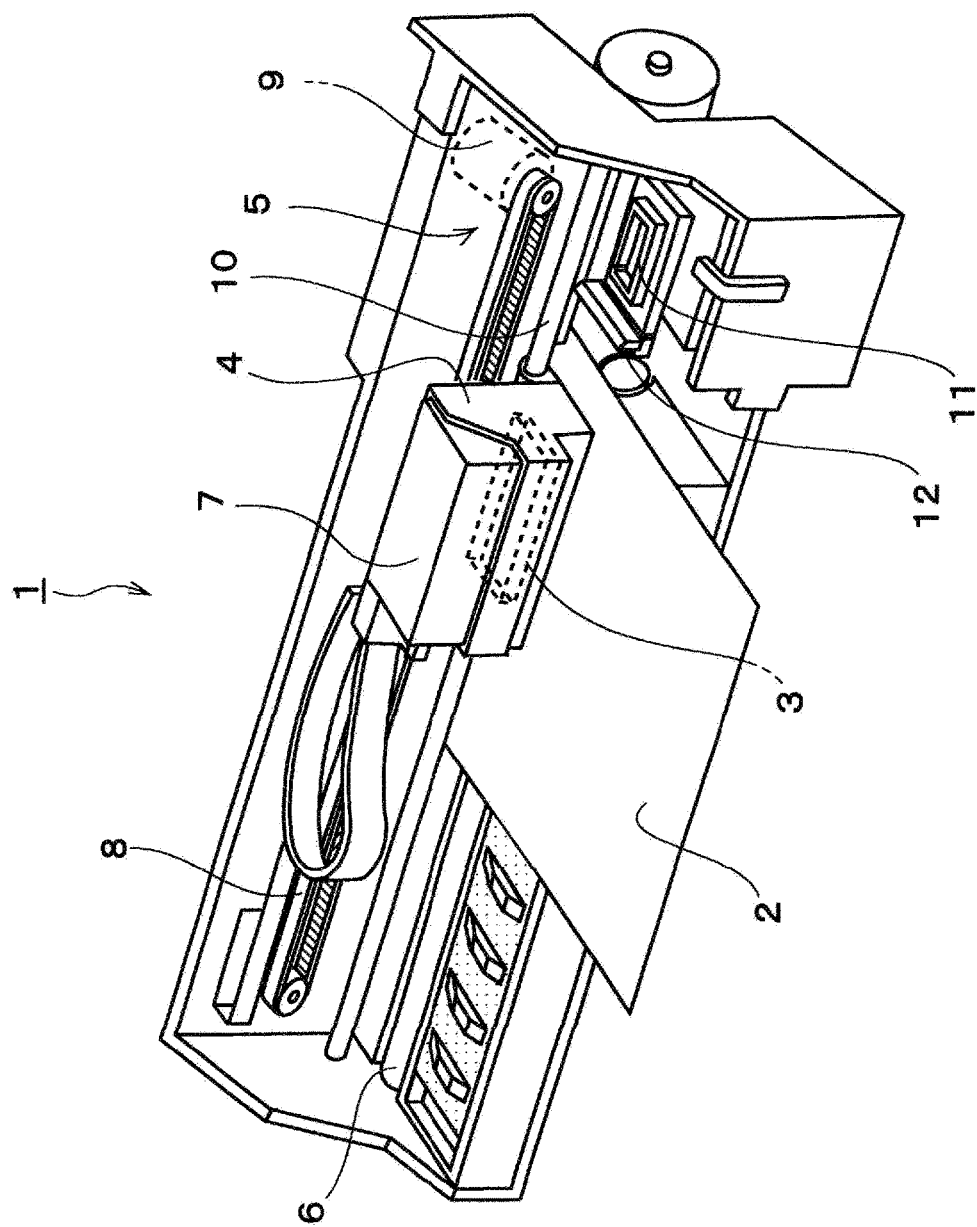

[Fig. 2]
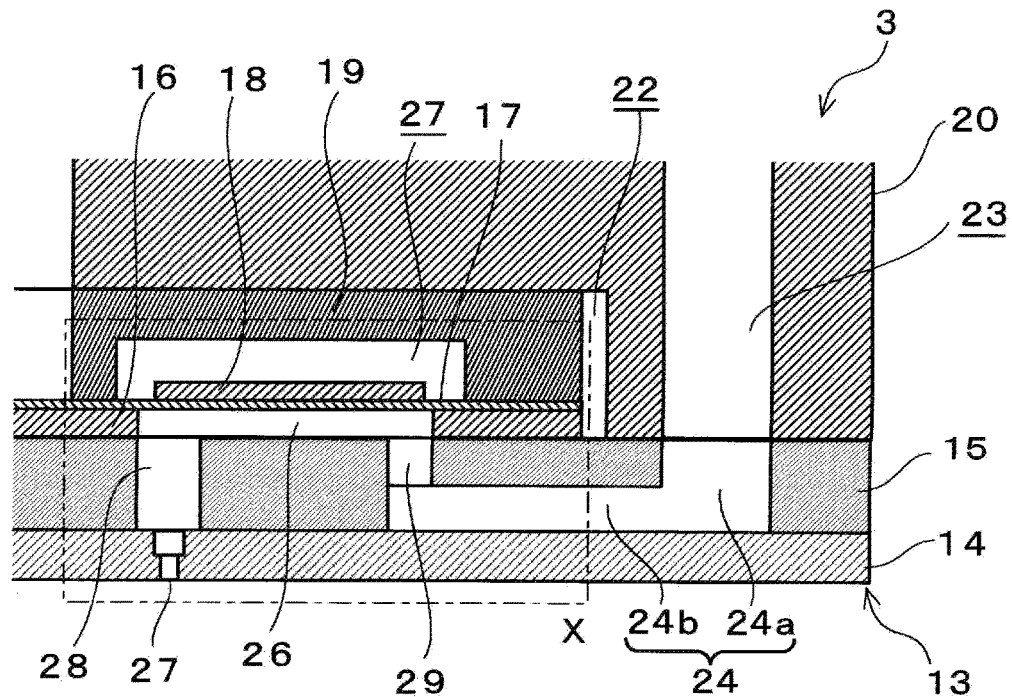
[Fig. 3]
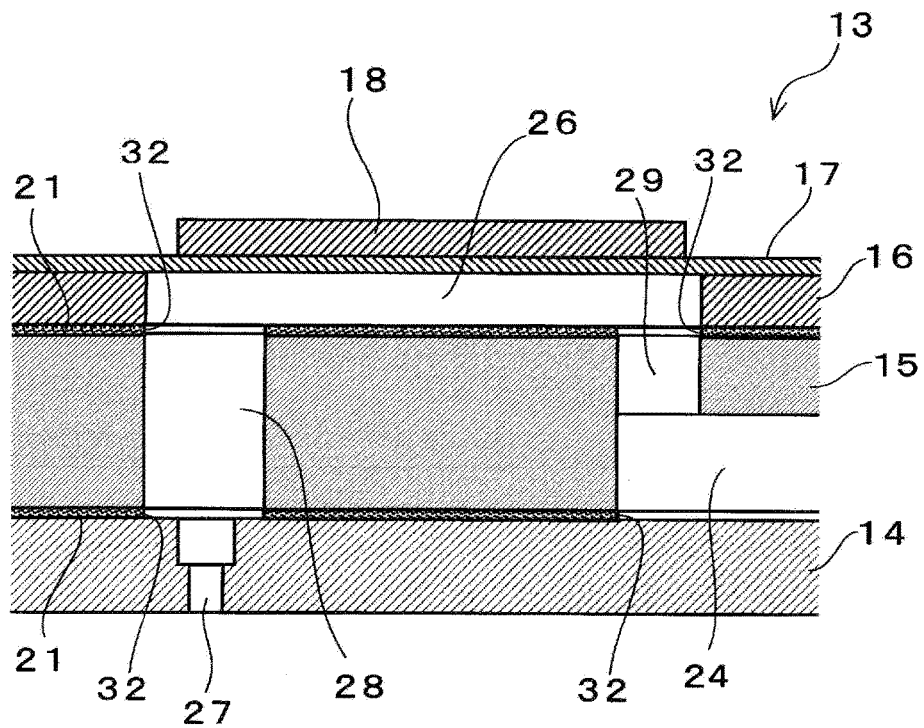

[Fig. 4]
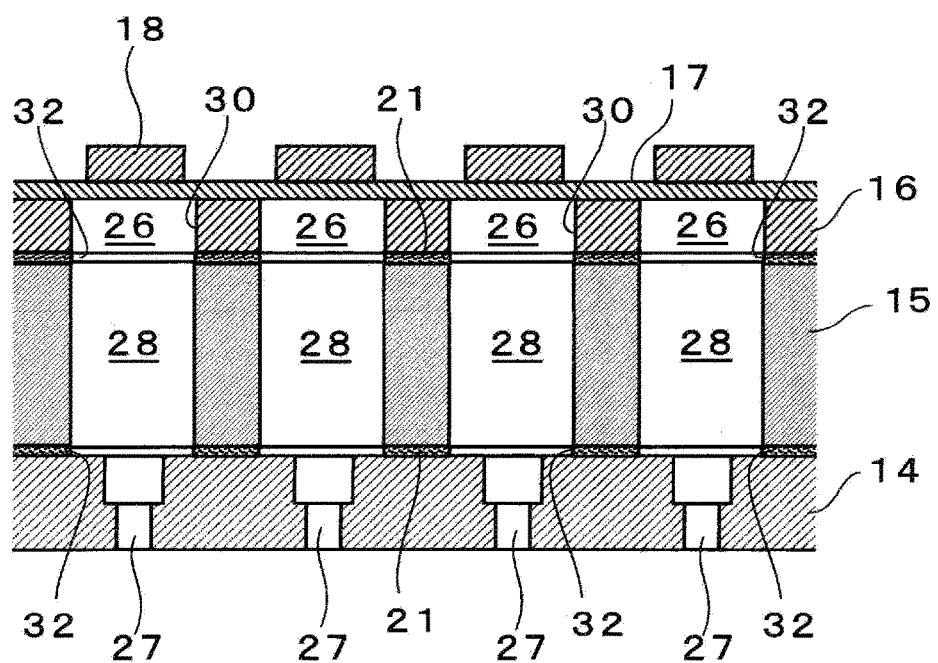

[Fig. 5]
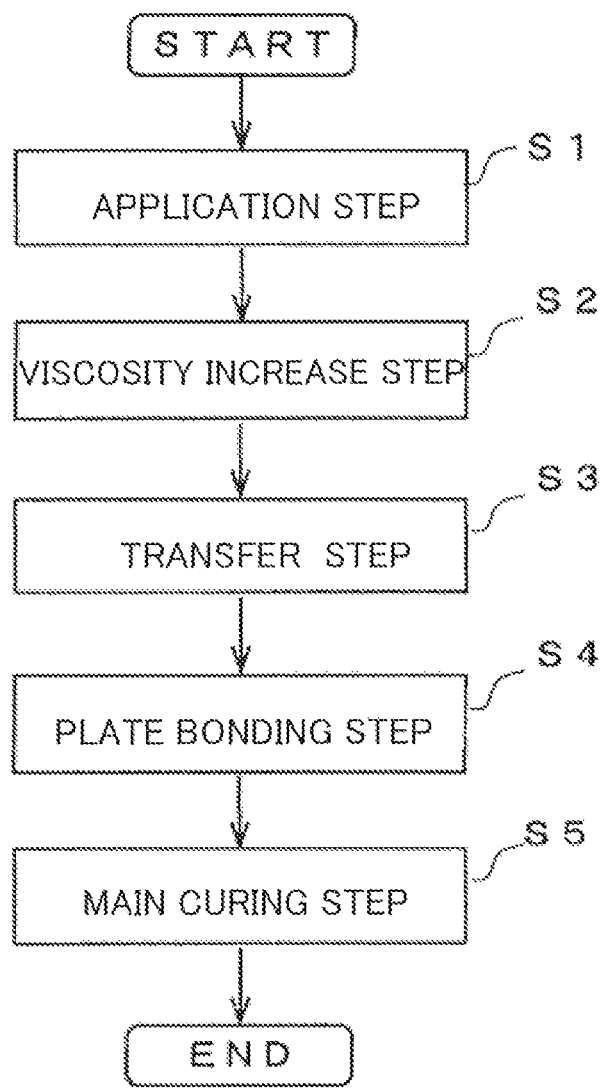

[Fig. 6]
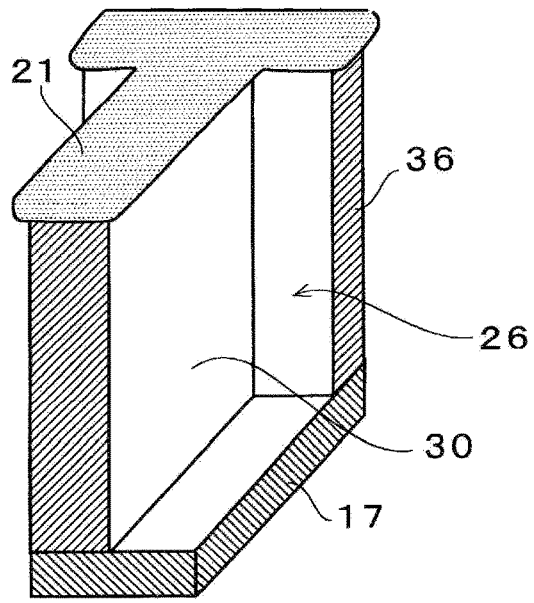
[Fig. 7]
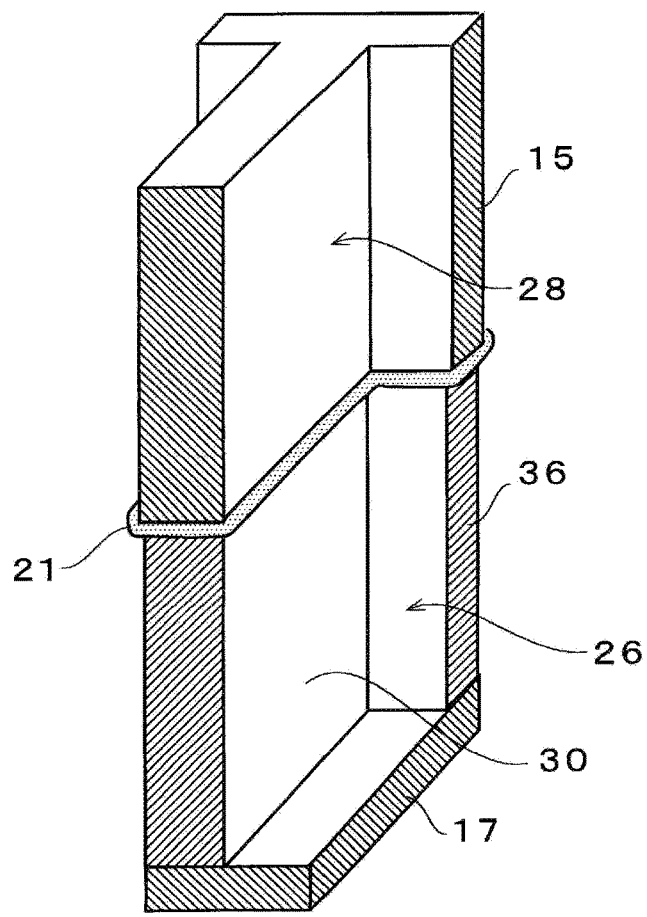

[Fig. 8]
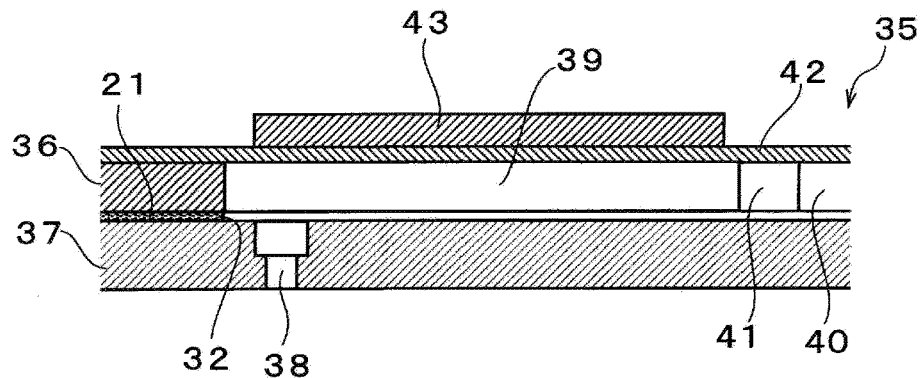
[Fig. 9]
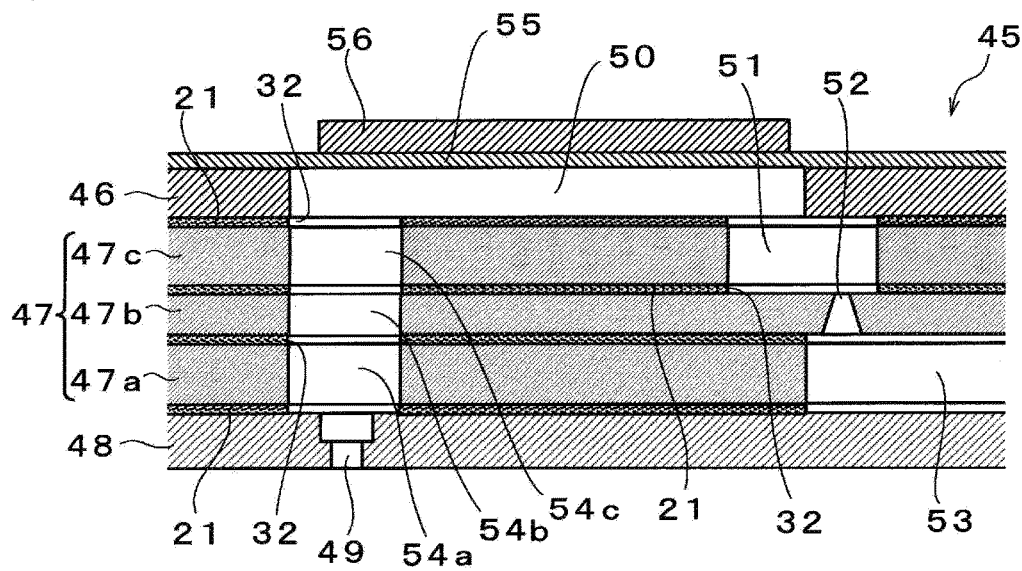
[Fig. 10]
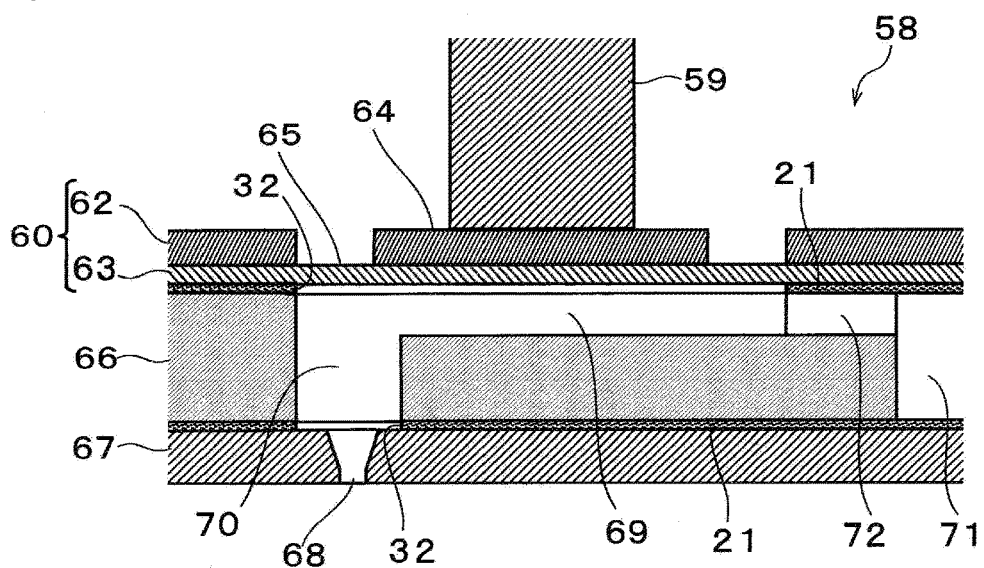

[Fig. 11]
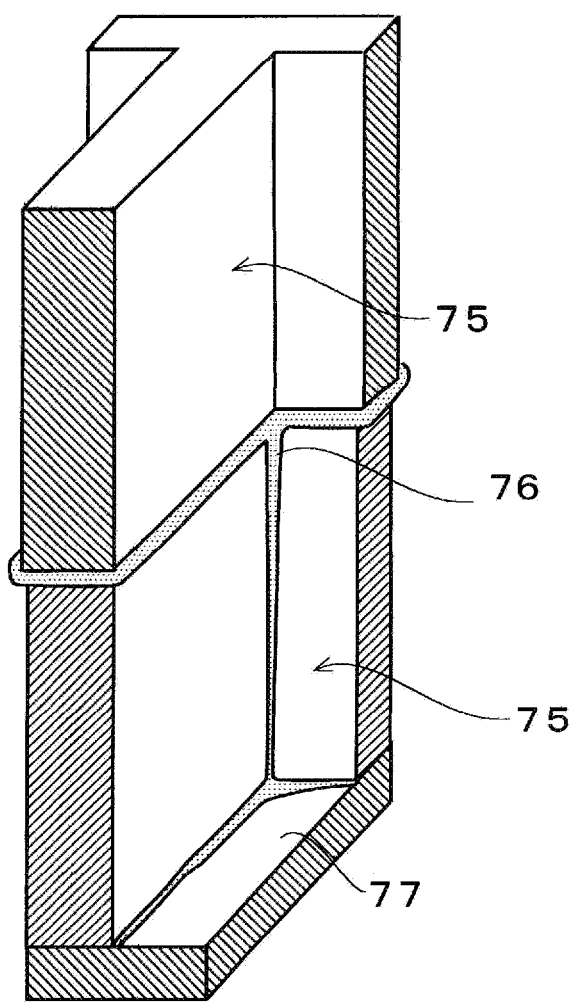

ELECTRONIC DEVICE, LIQUID EJECTION HEAD, AND METHOD OF MANUFACTURING ELECTRONIC DEVICE

TECHNICAL FIELD

The present invention relates to an electronic device to be used for liquid ejection or the like by a liquid ejection head such as an inkjet type recording head, the liquid ejection head, and a method of manufacturing the electronic device. In particular, the invention relates to an electronic device, a liquid ejection head, and a method of manufacturing the electronic device, the electronic device including a joined-structure assembly in which multiple structures are joined together with an adhesive agent.

BACKGROUND ART

The liquid ejection apparatus is an apparatus including a liquid ejection head, and configured to eject any of various kinds of liquids from this ejection head. As such liquid ejection apparatuses, there are image recording apparatuses such as an inkjet type printer and an inkjet type plotter, for example. Besides, nowadays, with an advantageous feature of the ability to land a very small volume of liquid drop onto a predetermined position precisely, liquid ejection apparatuses of this type have been also applied to various kinds of manufacture apparatuses. For example, the liquid ejection apparatuses are applied to a display manufacture apparatus that manufactures color filters for liquid crystal displays and the like, an electrode formation apparatus that forms electrodes for organic electro luminescence (EL) displays and field emission displays (FED), and a chip manufacture apparatus that manufactures biochips.

As an electronic device used in the liquid ejection head, there is one in which multiple plate-shaped structures (plates) are stacked and bonded together with an adhesive agent. These stacked structures are provided with a liquid passage that communicates with nozzles, and movable regions each of which applies a pressure change to liquid inside the liquid passage and thereby ejects the liquid from the corresponding nozzle. Heretofore, these structures have been bonded to each other with, for example, an epoxy-based adhesive agent. The epoxy-based adhesive agent, however, tends to relatively largely change in viscosity with a temperature change. For this reason, the adhesive agent between structures may flow out into the liquid passage side during heating and pressure application for curing the adhesive agent. Then, as illustrated in FIG. 11, the flowed-out adhesive agent 76 may further flow along a corner angle portion or any other portion of the passage 75 to reach the movable region 77, and then be cured on the movable region 77. In this case, the cured adhesive agent may inhibit driving and displacement of the movable region 77, and therefore adversely affect the liquid ejection. On the other hand, in the case of using an adhesive agent having a relatively high viscosity, the adhesive agent tends to become uneven in thickness when the adhesive agent is spread out thinly, and also has a risk that the structures are bonded insufficiently in some portions, and the liquid may leak from the insufficiently-bonded portions. In a configuration in which passages and so on are formed at higher density to meet the requirement of downscaling of the liquid ejection head, in particular, problems such as the aforementioned ones are more likely to occur because the regions joined with the adhesive agent are also narrow.

To address this, PTL 1 has proposed the invention in which a TiW thin film as a removable thin film is formed on portions where it is desired to avoid the adhesion of the adhesive agent, i.e., corner angle portions formed by the movable regions and the adjacent wall portions, and then the removable thin film is removed after the structures are bonded together, so that no adhesive agent remains on these portions.

SUMMARY OF INVENTION

Technical Problem

The above configuration of PTL 1, however, requires the step of forming the removable thin film and the step of removing the film, which results in an increase in the number of steps and other things. In addition, in PTL 1, a hydrogen peroxide solution as a remover liquid for the removable thin film is caused to flow to expel the removal thin film and the adhesive agent together from the nozzles of the liquid ejection head. In this step, there is a possibility that the adhesive agent may not be expelled completely, but may partly remain inside the passage. In this case, the remaining adhesive agent may act as an obstacle to the flow of the liquid or do the like, and resultantly may cause a trouble in the liquid ejection from the nozzles.

The invention has been made in view of the foregoing circumstances. An advantage of some aspects of the invention is to provide an electronic device, a liquid ejection head, and a method of manufacturing an electronic device that are capable of inhibiting an adhesive agent from flowing over and inhibiting driving of a movable region in a configuration in which multiple structures are joined together with the adhesive agent.

Solution to Problem

Solution 1

One aspect of the invention provides an electronic device including a joined-structure assembly in which a plurality of structures are joined together. At least one of the plurality of structures includes a movable region, a part of an adhesive agent applied between the structures faces a space communicating with the movable region, and the adhesive agent includes an organo-siloxane compound with three or more reaction points.

According to this aspect of the invention, the adhesive agent includes the organo-siloxane compound with three or more reaction points, and therefore the viscosity change of the adhesive agent with a temperature change is small. Thus, the adhesive agent between the structures is inhibited from flowing over to the space communicating with the movable region. This makes it possible to suppress a problem in that the adhesive agent cured on the movable region after running along the ink passage to the movable region adversely affects movement properties of the movable region.

Solution 2

In the aforementioned configuration, the organo-siloxane compound may desirably include a heterocyclic compound in the backbone.

With this configuration, since the organo-siloxane compound includes the heterocyclic compound in the backbone, a three-dimensional network structure is formed by three-dimensional crosslinking with the heterocyclic compound centered. Thus, after curing, the adhesive agent achieves higher strength, and accordingly is capable of joining the structures together more firmly. In addition, the polar property of the heterocyclic compound improves the adhesive power of the adhesive agent to metal.

Solution 3

Moreover, in the configuration of the aforementioned solution 2, the adhesive agent may desirably be a silicone resin including, as the heterocyclic compound, an isocyanurate compound in the backbone.

With this configuration, since the adhesive agent is the silicone resin including the isocyanurate compound in the backbone, the adhesive power to the structures to be joined can be enhanced.

Solution 4

Further, in the configuration of any one of the aforementioned solutions 1 to 3, the adhesive agent may desirably employ a composition including an epoxy group or an oxetanyl group.

With this configuration, since the adhesive agent includes the epoxy group or the oxetanyl group, the adhesive power and crosslinking performance can be more enhanced.

Solution 5

Moreover, in the configuration of any one of the aforementioned solutions 1 to 4, the adhesive agent may desirably employ a composition including a component having hydrosilane in a constituent molecule, a component including a vinyl group, and a platinum catalyst.

With this configuration, since the adhesive agent includes the platinum catalyst, the hydrosilane and the vinyl group quickly undergo an addition reaction by hydrosilylation. Thus, the adhesive agent can be completely cured quickly without causing outgassing or curing shrinkage during the curing by a heat treatment. This improves the productivity.

Solution 6

Further, the configuration of any one of the aforementioned solutions 1 to 5 may employ a configuration in which the movable region is a driven region or an active region.

With this configuration, deterioration in the movement properties of the movable region due to flowing-over of the adhesive agent can be suppressed irrespective of whichever of the driven region and the active region the movable region is. Thus, the yield is improved, and highly-reliable electronic devices can be provided.

Solution 7

In addition, the configuration of any one of the aforementioned solutions 1 to 5 may employ a configuration in which the movable region is provided with a piezoelectric element that functions as a part of the movable region.

With this configuration, driving of the piezoelectric element functioning as the part of the movable region is prevented from being hindered by the adhesive agent. Thus, the yield is improved, and highly-reliable electronic devices can be provided.

Solution 8

Further, a liquid ejection head of another aspect of the invention includes the electronic device having the configuration in the solution 7. The liquid ejection head includes: a first plate as one of the structures in which a pressure chamber is formed as the space communicating with a nozzle from which a liquid is to be ejected; and a second plate as another one of the structures in which a space communicating with the pressure chamber is formed. One surface forming the pressure chamber is a flexible surface that functions as a part of the movable region.

With this configuration, the adhesive agent between the first plate and the second plate is inhibited from flowing over to the space side communicating with the flexible surface which is the movable region. This makes it possible to suppress a problem in that the adhesive agent cured on the movable region after running along the space such as the pressure chamber to the movable region adversely affects the movement properties of the movable region. In addition, since the adhesive agent in the bonding region can have an even thickness, a defect in bonding of the plates can be minimized. This reduces a risk of liquid leakage from portions bonded insufficiently. Moreover, since the plates as the structures are bonded firmly, each wall (compartment wall) by which the pressure chambers are partitioned is inhibited from being distorted or displaced due to pressure change that occurs inside the pressure chambers during ejection of the liquid. This suppresses what is termed as crosstalk between adjacent nozzles in which the drop volume and drop velocity of the liquid ejected (ejection properties) vary between a case where the liquid is ejected from adjacent nozzles simultaneously, and a case where the liquid is ejected from a single nozzle solely. Further, even if the adhesive agent is exposed to the liquid, imbibition or deterioration of the adhesive agent is suppressed. Hence, the initial quality as manufactured can be maintained for a longer term.

Solution 9

The configuration of the solution 8 may employ a configuration where the second plate is a communicating plate in which a nozzle communicating port allowing the pressure chamber and the nozzle to communicate with each other is formed as the space.

With this configuration, the adhesive agent applied between the first plate and the second plate is inhibited from flowing over. This makes it possible to suppress a problem in that the adhesive agent cured on the movable region after running along the spaces such as the nozzle communicating port and the pressure chamber to the movable region adversely affects the movement properties of the movable region.

Solution 10

The configuration of the solution 9 may employ a configuration in which the communicating plate is a stacked body in which a plurality of plates each having an opening to form a part of the nozzle communicating port are stacked and bonded with the adhesive agent.

With this configuration, since the communicating plate is the stacked body in which the plurality of plates are bonded, the number of exposed portions of the bonding regions accordingly increases. However, even in this configuration, the adhesive agent is inhibited from flowing over the exposed portions to the spaces such as the pressure chamber and the nozzle communicating port. In addition, since the curing of the adhesive agent is quickly completed by the heat treatment, the productivity can be improved even though the configuration includes a larger number of plates (structures) stacked and joined together.

Solution 11

A method of manufacturing an electronic device according to still another aspect of the invention is a method of manufacturing an electronic device which includes a joined-structure assembly formed by joining a plurality of structures together, in which at least one of the plurality of structures includes a movable region, and a part of an adhesive agent applied between the structures faces a space communicating with the movable region. The method includes: applying the adhesive agent to a transfer sheet, the adhesive agent including an organo-siloxane compound with three or more reaction points; increasing a viscosity of the adhesive agent by incompletely curing the adhesive agent applied to the transfer sheet; and transferring the adhesive agent to a surface of one of the structures in each joint pair.

With this manufacturing method, the adhesive agent includes the organo-siloxane compound with the three or more reaction points. Thus, before the increasing of the viscosity, the adhesive agent has a relatively low viscosity and therefore is easy to apply in even thickness. Then, after the increasing of the viscosity, the adhesive agent has a relatively high viscosity, and therefore is inhibited from flowing out between the structures to the space communicating with the movable region.

Solution 12

In the manufacturing method of the solution 11, it is desirable that the adhesive agent be an addition-type silicone resin and the increasing of the viscosity be performed by a heat treatment.

With this manufacturing method, the viscosity of the adhesive agent is increased by the heat treatment and thus is easy to control. In addition, since the hydrosilane and the vinyl group undergo an addition reaction by hydrosilylation quickly, the adhesive agent does not cause outgassing or curing shrinkage during the viscosity increase by the heat treatment, and the treatment can be completed quickly. This improves the productivity.

Solution 13

The manufacturing method of the solution 12 may desirably include curing the adhesive agent by a heat treatment after the transferring of the adhesive agent.

With this manufacturing method, the main curing of the adhesive agent is performed by the heat treatment. Thus, the adhesive agent does not cause outgassing or curing shrinkage during the main curing by the heat treatment, and the treatment can be completed quickly. This improves the productivity.

BRIEF DESCRIPTION OF DRAWINGS

FIG. 1 is a perspective view of a configuration of a printer.

FIG. 2 is a cross sectional view illustrating an important portion of a recording head.

FIG. 3 is an enlarged cross sectional view of a region X in FIG. 2.

FIG. 4 is a cross sectional view of FIG. 3 which is taken along a nozzle array direction.

FIG. 5 is a flowchart for explaining steps of bonding plates.

FIG. 6 is a schematic view for explaining a state where an adhesive agent is transferred to a plate.

FIG. 7 is a schematic view for explaining a state where plates are bonded together.

FIG. 8 is a cross sectional view of an important part for explaining a configuration of an electronic device in a second embodiment.

FIG. 9 is a cross sectional view of an important part for explaining a configuration of an electronic device in a third embodiment.

FIG. 10 is a cross sectional view of an important part for explaining a configuration of an electronic device in a fourth embodiment.

FIG. 11 is a schematic view for explaining flowing-over of an adhesive agent.

DESCRIPTION OF EMBODIMENTS

Hereinafter, embodiments for carrying out the intention are described with reference to the accompanying drawings. In the embodiments described below, various matters are specified as preferable specific examples of the invention. However, the scope of the invention should not be limited to these embodiments, unless it is particularly stated that the invention is limited. The following description is provided by taking, as an example, an inkjet type printer (hereinafter, a printer) that is one type of liquid ejection apparatus equipped with an inkjet type recording head (hereinafter, a recording head) that is one type of liquid ejection head including an electronic device according to the invention.

A configuration of a printer 1 is described with reference to FIG. 1. The printer 1 is an apparatus that records an image and the like on a surface of a recording medium 2 such as recording paper by ejecting ink onto the surface of the recording medium 2. This printer 1 includes a recording head 3 that ejects ink, a carriage 4 to which the recording head 3 is attached, a carriage moving mechanism 5 that moves the carriage 4 in main scan directions, a platen roller 6 that transports the recording medium 2 in a sub-scan direction, and so on. The ink as one type of liquid is stored in an ink cartridge 7 as a liquid supply source. This ink cartridge 7 is detachably mounted on the recording head 3. Alternatively, the printer 1 may employ another configuration in which the ink cartridge 7 is arranged on a main body side of the printer 1, and supplies the ink to the recording head 3 via an ink supply tube.

The above carriage moving mechanism 5 includes a timing belt 8. Then, this timing belt 8 is driven by a pulse motor 9 such as a DC motor. Thus, while the pulse motor 9 is operating, the carriage 4 reciprocates in the main scan directions (width direction of the recording medium 2) while being guided by a guide rod 10 provided to extend between two sides of the printer 1.

FIG. 2 is a cross sectional view illustrating an internal configuration of the recording head 3 (one type of liquid ejection head of the invention). FIG. 3 is an enlarged cross sectional view of a region X in FIG. 2. Then, FIG. 4 is a cross sectional view of FIG. 3 which is taken along a nozzle array direction. Here, for convenience, the following description is provided with a stacking direction of members defined as an upper-lower direction. In addition, in FIGS. 3 and 4, a protective plate 19 is omitted from illustration. The recording head 3 in this embodiment has a stack structure assembly in which multiple plates (corresponding to structures in the invention), i.e., a nozzle plate 14, a communicating plate 15 (corresponding to a second plate in the invention), and a pressure-chamber forming plate 16 (corresponding to a first plate in the invention) are assembled to a unit by being stacked in that order and being bonded to each other with an adhesive agent 21 (described later). Then, an elastic film 17, piezoelectric elements 18 (one type of actuator), and a protective plate 19 are stacked on a surface of the pressure-chamber forming plate 16 on the opposite side to the communicating plate 15 in this stack structure assembly, and thereby an electronic device 13 in the invention is formed. This electronic device 13 is attached to a case 20, and thereby the recording head 3 is formed.

The case 20 is a box-shaped member made of a synthetic resin. The electronic device 13 is fixed on a bottom surface side of the case 20. On a lower surface side of the case 20, a housing cavity 22 is formed in a rectangular parallelepiped shape and is recessed from the lower surface of the case 20 to a middle portion thereof in a height direction. In the state where the electronic device 13 is joined to the lower surface of the case 20, the pressure-chamber forming plate 16, the elastic film 17, the piezoelectric elements 18, and the protective plate 19 are housed in the housing cavity 22. In addition, an ink introducing passage 23 is formed in the case 20. The ink from the ink cartridge 7 is introduced to a common liquid chamber 24 in the stack structure assembly through the ink introducing passage 23.

The pressure-chamber forming plate 16 in this embodiment is made of a single crystal silicon substrate (hereinafter, simply referred to as a silicon substrate). In this pressure-chamber forming plate 16, multiple pressure chamber cavities each defining a pressure chamber 26 (corresponding to a space in the invention) are formed corresponding to respective nozzles 27 in the nozzle plate 14 by anisotropic etching. Since the spaces to serve as passages, such as the pressure chambers, are formed in the silicon substrate by anisotropic etching as described above, the dimensions and shapes of the spaces can be formed with much higher precision. Openings of the pressure chamber cavities on one side (upper side) of the pressure-chamber forming plate 16 are sealed by the elastic film 17. Meanwhile, the communicating plate 15 is joined to the surface of the pressure-chamber forming plate 16 on the opposite side to the elastic film 17, and thus the openings of the pressure chambers 26 on the other side are sealed by the communicating plate 15. In this way, the pressure chambers 26 are delimited. Here, a portion where the upper opening of each of the pressure chambers 26 is sealed by the elastic film 17 corresponds to a flexible surface that is displaced with driving of the corresponding piezoelectric element 18. Then, a portion including the flexible surface and the piezoelectric element 18 corresponds to a movable region or an active region in the invention. Here, another configuration may be employed in which the pressure-chamber forming plate 16 and the flexible surface are formed of a single substrate. Specifically, in the employable configuration, the pressure-chamber forming plate 16 is etched from the lower surface side to form each pressure chamber cavity while a thin-wall portion having a small thickness is left on the upper surface side of the pressure-chamber forming plate 16; this thin-wall portion functions as a flexible surface (movable region).

Each pressure chamber 26 in this embodiment is a space long in a direction (second direction) orthogonal to an array direction (first direction) of the nozzles 27. One end of the pressure chamber 26 in the second direction communicates with the corresponding nozzle 27 through a nozzle communicating port 28 (one type of space in the invention) in the communicating plate 15. The other end of the pressure chamber 26 in the second direction communicates with a common liquid chamber 24 (one type of space in the invention) through an individual communicating port 29 (one type of space in the invention) of the communicating plate 15. Then, the multiple pressure chambers 26 are provided corresponding to the respective nozzles 27 and arrayed in the nozzle array direction (first direction) with compartment walls 30 interposed in between.

The communicating plate 15 is a plate member made of a silicon substrate as is the case with the pressure-chamber forming plate 16. In this communicating plate 15, a cavity as the common liquid chamber 24 (also referred to as a reservoir or manifold) common to the multiple pressure chambers 26 in the pressure-chamber forming plate 16 is formed by anisotropic etching. This common liquid chamber 24 is the cavity long in the array direction of the pressure chambers 26 (that is, the first direction). The common liquid chamber 24 in this embodiment includes a first liquid chamber 24a passing through the communicating plate 15 in a plate-thickness direction, and a second liquid chamber 24b formed in a portion of the communicating plate 15 extending from the lower surface side toward the upper surface side thereof, up to a middle portion of the communicating plate 15 in the plate-thickness direction with a thin-wall portion left on the upper surface side. A first end of this second liquid chamber 24b in the second direction (the end on the side farther from the nozzles 27) communicates with the first liquid chamber 24a, while a second end thereof in the same direction is formed at a position below the pressure chambers 26. On the second end of the second liquid chamber 24b, i.e., the end on the opposite side to the first liquid chamber 24a, the multiple individual communicating ports 29 are formed to pass through the thin-wall portion, and arrayed in the first direction corresponding to the respective pressure chambers 26. Lower ends of the individual communicating ports 29 communicate with the second liquid chamber 24b, and upper ends of the individual communicating ports 29 communicate with the respective pressure chambers 26 in the pressure-chamber forming plate 16.

The aforementioned nozzle plate 14 is a plate member in which the multiple nozzles 27 are opened and arranged in an array form. In this embodiment, a nozzle array is formed such that the multiple nozzles 27 are arrayed at a pitch corresponding to a dot formation density. The nozzle plate 14 in this embodiment is made of a silicon substrate, and the cylindrical nozzles 27 are formed in the silicon substrate by dry etching. Thus, in the electronic device 13 in this embodiment, an ink passage is formed which starts from the above common liquid chamber 24 and leads to the nozzles 27 via the individual communicating ports 29, the pressure chambers 26, and the nozzle communicating ports 28.

The elastic film 17 formed on the upper surface of the pressure-chamber forming plate 16 is made of silicon dioxide having a thickness of about 1 μm, for example. In addition, an insulation film not illustrated is formed on the elastic film 17. This insulation film is made of zirconium oxide, for example. Then, the piezoelectric elements 18 are formed at positions on the elastic film 17 and the insulation film corresponding to the respective pressure chambers 26. To form the piezoelectric elements 18 in this embodiment, a metal lower electrode film, a piezoelectric layer made of lead zirconate titanate (PZT) or the like, and a metal upper electrode film (all of which are not illustrated) are stacked in this order on the elastic film 17 and the insulation film. In this configuration, one of the upper electrode film and the lower electrode film is formed as a common electrode, and the other is formed as individual electrodes. The electrode film to form the individual electrodes and the piezoelectric layer are patterned corresponding to the respective pressure chambers 26. In each of the piezoelectric elements 18, a region where the piezoelectric layer is sandwiched between the upper electrode film and the lower electrode film is a piezoelectric active portion where a piezoelectric statin occurs with application of a voltage to the two electrodes. Then, the piezoelectric active portion is flexibly deformed depending on a change in the applied voltage, and accordingly the flexible surface defining one surface of the pressure chamber 26, that is, the elastic film 17 is displaced in a direction toward the nozzle 27 or away from the nozzle 27. In this way, a pressure change occurs in the ink inside each of the pressure chambers 26, and the ink is ejected from the corresponding nozzle 27 by using the pressure change.

As illustrated in FIGS. 3 and 4, the nozzle plate 14, the communicating plate 15, and the pressure-chamber forming plate 16 constituting the above electronic device 13 are joined to each other with the adhesive agent 21. The adhesive agent 21 is first applied to a transfer sheet, and then is transferred to joint surfaces of the plates, as described later. Here, a region where the adhesive agent is present between each pair of the joint surfaces of the plates corresponds to a bonding region in the invention. In this embodiment, the electronic device 13 includes the movable region (active region) composed of the flexible surface defining the one surface of the pressure chamber 26 and the piezoelectric element 18 that displaces the flexible surface, and also includes the spaces communicating with the movable region, for example, the ink passage including the nozzle communicating port 28, the pressure chamber 26, individual communicating port 29, and the common liquid chamber 24, or the like. In such configuration as described above, exposed portions 32 are formed in which portions of the bonding regions (edges of the bonding regions) face (or are exposed to) the foregoing spaces. In such a configuration, the epoxy-based adhesive agent has been heretofore used as the adhesive agent 21. However, there has been a problem that the adhesive agent 21 flows over the exposed portions 32 into the ink passage because the viscosity of the adhesive agent 21 is temporarily lowered during curing by the heat treatment. Then, if the adhesive agent flowed over any of the exposed portions 32 further flows along a corner angle portion or any other portion of the passage, reaches the flexible surface of the elastic film 17 as the movable region, and then is cured thereon, the cured adhesive agent may inhibit driving and displacement of the flexible surface. On the other hand, in the case of using the adhesive agent 21 having a relatively high viscosity, the adhesive agent tends to have thickness unevenness when the adhesive agent is spread out thinly on a transfer sheet. Hence, there has also been a risk that some portions of the plates may be bonded only insufficiently with the adhesive agent 21 with the uneven thickness, and resultantly the ink may leak from the insufficiently-bonded portions.

To address these problems, the electronic device 13 according to the invention uses, as the adhesive agent 21, an addition-type silicone resin including an organo-siloxane compound with three or more reaction points (crosslinking points), or more specifically, an organo-siloxane compound including a heterocyclic compound in the backbone. As the silicone resin, a silicone resin including an isocyanurate compound (for example, triallyl isocyanurate) as the heterocyclic compound is preferable from the perspective of enhancement of the adhesive power to a joining target, and can be made to have good affinities for both an organic component and an inorganic component. Here, besides the trifunctional organo-siloxane compound, a bifunctional organo-siloxane compound may be included. As the heterocyclic compound, for example, imidazole, pyrazole, pyrazine, 1,3,5-triazine, benzimidazole, benzofuran, or the like may be also employed. In the adhesive agent 21 made of such a resin composition, siloxane bonds having a high binding energy and being chemically stable are included as a main chain, and components including organic groups are bonded to the siloxane bonds. With this composition, the adhesive agent 21 ensures appropriate flexibility during application (described later), and achieves advantageous properties of higher heat-resistance and smaller viscosity change with a temperature change. Thus, when the adhesive agent 21 is applied and spread out, the thickness of the adhesive agent 21 can be made as even as possible, and therefore the adhesive agent 21 can be inhibited from being uneven in film thickness. Meanwhile, during the heat treatment for curing, the adhesive agent 21 can be inhibited from flowing over the bonding regions. In particular, a silicone including alkyl siloxane including an alkyl group (for example, dimethyl silicone) can achieve further reduction in the viscosity change with a temperature change.

A chemical structure including the heterocyclic compound as the backbone is one in which the silicone component is stably included, and thus achieves higher chemical resistance (ink resistance). Thus, even if the adhesive agent 21 is exposed to the ink, imbibition or deterioration of the adhesive agent 21 can be suppressed, and the initial quality as manufactured can be maintained for a longer term. In addition, the adhesive agent 21 offers a three-dimensional network structure by three-dimensional crosslinking with the heterocyclic compound centered, and thus the adhesive agent 21 after curing achieves higher strength. For this reason, the adhesive agent 21 can join structures to each other more firmly. Moreover, the adhesive power of the adhesive agent 21 to metal is improved due to a polar property of the heterocyclic compound. Besides, the including of the heterocyclic compound further produces various advantageous effects such as improvements in the heat resistance, the crosslinking efficiency, and the hydrolysis resistance. Then, it is desirable to further include an epoxy group or an oxetanyl group as an organic component. This improves the adhesive power and crosslinking performance. In addition, the adhesive agent 21 includes a component including hydrosilane in a constituent molecule, a component including a vinyl group, and a platinum-based catalyst, and thus the hydrosilane and the vinyl group undergo an addition reaction rapidly (for example, within several seconds) through hydrosilylation. Hence, the adhesive agent does not cause outgassing or curing shrinkage during the curing by the heat treatment (described later), and the curing can be completed quickly. This improves the productivity.

For manufacturing the electronic device 13 in this embodiment, the elastic film 17 and the insulation film are firstly formed in this order on the upper surface of the pressure-chamber forming plate 16 (the silicon substrate in which the pressure chamber cavities 34 are not formed yet), and then the piezoelectric elements 18 are formed by baking. The pressure-chamber forming plate 16 in this state is anisotropically etched from the lower side (the surface side to be joined to the communicating plate 15) by using an etchant made of an aqueous potassium hydroxide solution, and thereby the cavities (spaces) to form the pressure chambers 26 are formed. In a similar manner, the spaces such as the common liquid chamber 24, the individual communicating ports 29, and the nozzle communicating ports 28 are formed in the communicating plate 15 by anisotropic etching. Meanwhile, the nozzles 27 are formed in the nozzle plate 14 by dry etching.

FIG. 5 is a flowchart for explaining steps of joining plates. FIG. 6 is a schematic view for explaining a state where an adhesive agent is transferred to a plate, and FIG. 7 is a schematic view for explaining a state where plates are joined together.

After the spaces to form the ink passage are formed in the plates constituting the electronic device 13, then the plates are bonded to each other with the adhesive agent 21. The following description is provided for the steps of joining the pressure-chamber forming plate 16 and the communicating plate 15, in particular. First, the adhesive agent 21 is applied to a transfer sheet, which is not illustrated, on a squeegee table while being spread out to a predetermined thickness by a squeegee (application step S1). Here, the adhesive agent 21 in this embodiment is soft before curing, and therefore can be spread out to a targeted thickness smoothly. Thus, the adhesive agent 21 applied is inhibited from being uneven in thickness. Next, the adhesive agent 21 applied to the transfer sheet is heated by a heat treatment to a temperature lower than in the case of a main curing step, which is described later, and thereby is cured to a certain degree at which the adhesive agent 21 is incompletely cured. In this way, the viscosity of the adhesive agent 21 is increased (viscosity increase step S2). Since the adhesive agent 21 is the addition type silicone resin, the adhesive agent 21 increases in viscosity due to hydrosilylation of the hydrosilane and the vinyl group by the heat treatment. The viscosity of the adhesive agent 21 can be controlled easily by setting the temperature and time for this heat treatment. Note that, such an increase in the viscosity of the adhesive agent 21 to a certain degree makes it possible to inhibit the adhesive agent 21 from flowing over in the following transfer step.

Subsequently, the adhesive agent 21 on the transfer sheet is transferred to the joint surface of the plate described above (transfer step S3). For example, as illustrated in FIG. 6, in the case of joining the pressure-chamber forming plate 16 and the communicating plate 15, the transfer sheet to which the adhesive agent 21 applied is bonded to the joint surface (the surface on the communicating plate 15 side) of the pressure-chamber forming plate 16 which is one of the two plates, while being pressed at a predetermined pressure. Thereafter, only the transfer sheet is peeled off from the pressure-chamber forming plate 16. In this way, the adhesive agent 21 is transferred with an even thickness to part of the joint surface of the pressure-chamber forming plate 16 other than the openings of the spaces (the pressure chambers 26) in the pressure chamber cavities 34. In the same manner, the adhesive agent 21 is transferred to the joint surface of one of the communicating plate 15 and the nozzle plate 14.

After the adhesive agent 21 is transferred to the joint surface of the plate, then the other plate of the joint pair is bonded to the surface on which the adhesive agent 21 is transferred (plate bonding step S4). More specifically, as illustrated in FIG. 7, the communicating plate 15 of the joint pair is joined to the surface of the pressure-chamber forming plate 16 on which the adhesive agent 21 is transferred. In this step, the adhesive agent 21 is stopped from flowing over as described above. In a similar manner, the nozzle plate 14 is joined to the surface of the communicating plate 15 on the opposite side to the pressure-chamber forming plate 16. In this case, for example, the adhesive agent 21 is transferred to the surface of the communicating plate 15 to be joined to the nozzle plate 14, and the two plates are joined. In this way, the electronic device 13 is formed as a unit, and the ink passage starting from the common liquid chamber 24 and leading to the nozzles 27 through the individual communicating ports 29, the pressure chambers 26, and the nozzle communicating ports 28 is formed inside the electronic device 13.

Next, the adhesive agent 21 between the joint surfaces of the plates is further cured by a heat treatment (main curing step S5). The adhesive agent 21 thus cured forms a three-dimensional network structure, by which the plates are bonded and joined together more firmly. In this regard, if the joint strength between the plates is insufficient, a configuration including multiple pressure chambers partitioned by the compartment walls 30 as in the electronic device 13 in this embodiment may have what is termed as crosstalk as follows. Specifically, in order to eject the ink from the nozzles 27, the piezoelectric elements 18 are driven to cause pressure change in the ink inside the pressure chambers 26. At this time, if the compartment walls 30 are displaced due to the pressure change, the ink may have a pressure loss, and the crosstalk may occur in which ejection properties of the ink from the nozzles 27 (a drop volume and drop velocity of the ink) vary. To address this problem, in the electronic device 13 in this embodiment, the plates are joined together so firmly with the three-dimensional network structure in the adhesive agent 21 that the compartment walls 30 are inhibited from being displaced due to the pressure change in the ink inside the pressure chambers 26 when the pressure change occurs. Consequently, the occurrence of the aforementioned crosstalk is suppressed. In addition, since the adhesive agent 21 in this embodiment has a small viscosity change with a temperature change, the adhesive agent is inhibited from flowing over the exposed portions of the bonding regions to the ink passage side such as the pressure chambers during the heat treatment, unlike the conventional epoxy-based adhesive agent. This makes it possible to suppress a problem in that the adhesive agent cured on the movable region after running along the ink passage to the movable region adversely affects movement properties of the movable region. In other words, in this embodiment, the displacement of the flexible surface of the elastic film 17 with the driving of the piezoelectric element 18 is prevented from being inhibited. This results in suppression of adverse effects on the drop volume and drop velocity of the ink ejected from the nozzle 27. Accordingly, the yield is improved, and the reliability of the electronic device 13 and the recording head 3 is enhanced. In addition, the adhesive agent 21 is inhibited from being uneven in film thickness, which reduces in turn a risk of ink leakage from portions insufficiently bonded. Furthermore, since the adhesive agent 21 has favorable chemical resistance (ink resistance), imbibition or deterioration of the adhesive agent 21 can be suppressed even after the joining, whereby the joint strength is less likely to change. Thus, it is possible to provide the electronic device 13 highly reliable for a long term, and the recording head 3 including the electronic device 13.

It should be noted that the invention is not limited to the foregoing embodiment, but may be modified variously based on the description in claims.

FIG. 8 is a cross sectional view of an important part for explaining a configuration of an electronic device 35 in a second embodiment. The electronic device 13 in the aforementioned first embodiment has the configuration including, as the structures, the pressure-chamber forming plate 16, the communicating plate 15, and the nozzle plate 14 joined together. The electronic device 35 in the second embodiment illustrated in FIG. 8 is different from that in the first embodiment in that the electronic device 35 does not include a communicating plate. In other words, the electronic device 35 in this embodiment includes a stack structure assembly in which a pressure-chamber forming plate 36 and a nozzle plate 37 are joined together with the aforementioned adhesive agent 21, while pressure chambers 39, a common liquid chamber 40, and individual communicating ports 41 allowing the chambers 39 and 40 to communicate with each other are formed in the pressure-chamber forming plate 36, and nozzles 38 are opened in the nozzle plate 37. Here, the other components such as an elastic film 42 and piezoelectric elements 43 joined to the upper surface side of the pressure-chamber forming plate 36 (the surface on the opposite side to the nozzle plate 37) are the same as those in the first embodiment. Also in the configuration of the second embodiment, the adhesive agent 21 is inhibited from flowing over the exposed portions 32 of the bonding regions between the pressure-chamber forming plate 36 and the nozzle plate 37 to the ink passage side such as the pressure chambers 39. This makes it possible to suppress a problem in that the adhesive agent 21 cured on the movable region after running along the ink passage to the movable region adversely affects the movement properties of the movable region. Also in this embodiment, the pressure-chamber forming plate 36 and the nozzle plate 37 are firmly joined together with the three-dimensional network structure of the adhesive agent 21, which in turn makes contribution to reduction in crosstalk.

FIG. 9 is a cross sectional view of an important part for explaining a configuration of an electronic device 58 in a third embodiment. The electronic device 58 in this embodiment has a stack structure assembly including a pressure-chamber forming plate 46, a communicating plate 47, and a nozzle plate 48 joined together with the adhesive agent 21 as in the first embodiment, but is different from that of the first embodiment in that the communicating plate 47 is a stacked body in which multiple plates are joined together with the adhesive agent 21. Specifically, the communicating plate 47 in this embodiment is formed by joining first to third communicating plates 47a, 47b and 47c together with the adhesive agent 21, while first nozzle communicating ports 54a (each being an opening to constitute a part of a nozzle communicating port 54) and a common liquid chamber 53 are formed in the first communicating plate 47a, second nozzle communicating ports 54b (each being an opening to constitute a part of the nozzle communicating port 54) and individual communicating ports 52 are formed in the second communicating plate 47b, and third nozzle communicating ports 54c (each being an opening to constitute a part of the nozzle communicating port 54) and individual liquid chambers 51 are formed in the third communicating plate 47c. Each of these communicating plates 47a to 47c is formed of, for example, a metal plate which is made of stainless steel or the like, and in which spaces to constitute the ink passage such as the nozzle communicating ports 54 are opened by press working. The individual liquid chamber 51 is a space provided for each of the pressure chambers 50 and arranged between the pressure chamber 50 and the common liquid chamber 53. This individual liquid chamber 51 and the pressure chamber 50 directly communicate with each other, and the individual liquid chamber 51 and the common liquid chamber 53 communicate with each other via the corresponding individual communicating port 52. Here, the other components such as an elastic film 55 and piezoelectric elements 56 joined to the upper surface side of the pressure-chamber forming plate 46 (the surface on the opposite side to the nozzle plate 48) are the same as those in the first embodiment.

In the configuration where an increased number of structures (plates) are bonded together, the number of exposed portions 32 of the bonding regions accordingly increases. However, also in this configuration, the adhesive agent 21 is inhibited from flowing over the exposed portions 32 to the ink passage side (space side) such as the pressure chambers 50. In addition, since the curing of the adhesive agent 21 is quickly completed by the heat treatment, the productivity can be improved even though the configuration includes an increased number of structures stacked and joined together. In this embodiment, since the communicating plate 47 made of metal is employed, the adhesive power of the adhesive agent to the communicating plate 47 is improved due to the polar property of the heterocyclic compound included in the adhesive agent 21, which in turn makes contribution to the improvement of the joint strength between the plates. As a matter of course, also in this embodiment, the plates are firmly joined together with the three-dimensional network structure of the adhesive agent 21, which in turn makes contribution to reduction in crosstalk as well.

FIG. 10 is a cross sectional view of an important part for explaining a configuration of an electronic device 58 in a fourth embodiment. In the aforementioned three embodiments, the piezoelectric elements are described by taking, as an example, piezoelectric elements of a bending-vibration type that are bent and deformed in electric filed directions, but are not limited to those of this type. In the electronic device 58 of the fourth embodiment illustrated in FIG. 10, a piezoelectric element 59 is a piezoelectric element of a multi-layered type in which piezoelectric layers and electrode layers, not illustrated, are alternately stacked, and of a longitudinal-vibration type in which the piezoelectric element expands and shrinks in directions orthogonal to the stacking direction (electric field direction). Then, the electronic device 58 in this embodiment includes a stack structure assembly in which multiple structures, namely, a vibration plate 60, a pressure-chamber forming plate 66, and a nozzle plate 67 are joined together with the adhesive agent 21. The vibration plate 60 is a member in which a support plate 62 made of a material having relatively high stiffness, such for example as a stainless steel, and an elastic film 63 made of a synthetic resin material having flexibility, such for example as poly phenylene sulfide (PPS) are stacked. In this vibration plate 60, a portion of the support plate 62 at a position corresponding to each of pressure chambers 69 in the pressure-chamber forming plate 66 is removed in a ring shape by etching or the like, whereby an island portion 64 to which an end surface of the piezoelectric element 59 is to be joined, and a flexible portion 65 surrounding the island portion 64 are formed. Then, with expansion or shrinkage of the piezoelectric element 59, the island portion 64 is displaced, and thereby the capacity in the pressure chamber 69 is changed. In other words, the island portion 64, the flexible portion 65 and the piezoelectric element 59 function as the movable region (active region) in the invention. Here, the other components are the same as those in the first embodiment.

Also in the electronic device 58 in this embodiment, the adhesive agent 21 is inhibited from flowing over the exposed portions 32 of the bonding region between the vibration plate 60 and the pressure-chamber forming plate 66 or the exposed portions 32 of the bonding region between the pressure-chamber forming plate 66 and the nozzle plate 67, to the ink passage side such as the pressure chambers 69. This makes it possible to suppress a problem in that the adhesive agent 21 cured on the movable region after running along the ink passage to the movable region adversely affects the movement properties of the movable region. Also in this embodiment, the pressure-chamber forming plate 66 and the nozzle plate 67 are firmly joined together with the three-dimensional network structure of the adhesive agent 21, which in turn makes contribution to reduction in crosstalk.

Note that, in the foregoing description, the configurations each of which ejects the ink as one type of liquid from the nozzle by displacing the movable region (active region) are illustrated as non-limiting examples. The invention can be applied to any electronic device including a joined-structure assembly in which multiple structures are joined together, and at least one of the structures includes a movable region. For example, the invention can be applied to a device such for example as a sensor that detects a pressure change, vibration or displacement of a movable region as a driven region. Also, the invention can be applied to a case where a movable region as an active region is a drive mechanism such as a motor. In summary, the invention is preferable for a configuration in which structures are joined with an adhesive agent, and at least one of bonding regions has an exposed portion facing a space communicating with a movable region. Here, the space communicating with the movable region is not limited to a space through which a liquid flows.

In addition, the liquid ejection head is illustrated by taking the inkjet type of recording head 3 as an example, in the aforementioned embodiments. However, the invention can be also applied to any other type of liquid ejection head employing a configuration in which a space such as a liquid passage is formed by multiple plates as structures joined together with an adhesive agent. For example, the invention can be applied to colorant ejection heads for use to manufacture color filers for liquid crystal displays and the like, electrode-material ejection heads for use to form electrodes for organic electro luminescence (EL) displays, field emission displays (FED), and the like, and bioorganic substance ejection heads for use to manufacture biochips, and others. The colorant ejection heads for a display manufacture apparatus eject solutions of R (red), G (green) and B (blue) colorants as one type of liquid. The electrode-material ejection head for an electrode formation apparatus ejects an electrode material liquid as one type of liquid, and the bioorganic substance ejection head for a chip manufacture apparatus ejects a solution of a bio organic substance as one type of liquid.

REFERENCE SIGNS LIST 1 printer
3 recording head
13 electronic device
14 nozzle plate
15 communicating plate
16 pressure-chamber forming plate
17 elastic film
18 piezoelectric element
21 adhesive agent
24 common liquid chamber
26 pressure chamber
27 nozzle
28 nozzle communicating port
29 individual communicating port
30 compartment wall
32 exposed portion

CITATION LIST

Patent Literature

PTL 1: JP-A-2006-175654

The invention claimed is:

1. An electronic device comprising a joined-structure assembly in which a plurality of structures are joined together, wherein
at least one of the plurality of structures includes a movable region,
a part of an adhesive agent applied between the structures faces a space communicating with the movable region, and
the adhesive agent includes an organo-siloxane compound with a heterocyclic group in a backbone thereof, with three or more chains extending therefrom, providing three or more reaction points for cross-linking the organo-siloxane compound.

2. The electronic device according to claim 1, wherein the adhesive agent includes, as the heterocyclic group, an isocyanurate group in the backbone.

3. The electronic device according to claim 2, wherein the adhesive agent includes an epoxy group or an oxetanyl group.

4. The electronic device according to claim 1, wherein the adhesive agent includes a component including hydrosilane in a constituent molecule, a component including a vinyl group, and a platinum catalyst.

5. The electronic device according to claim 4, wherein the movable region is a driven region or an active region.

6. The electronic device according to claim 4, wherein the movable region is provided with a piezoelectric element that functions as a part of the movable region.

7. A liquid ejection head including the electronic device according to claim 2, comprising:
a first plate as one of the structures in which a pressure chamber is formed as the space communicating with a nozzle from which a liquid is to be ejected; and
a second plate as another one of the structures in which a space communicating with the pressure chamber is formed, wherein
one surface forming the pressure chamber is a flexible surface that functions as a part of the movable region.

8. The liquid ejection head according to claim 7, wherein the second plate is a communicating plate in which a nozzle communicating port allowing the pressure chamber and the nozzle to communicate with each other which is formed as the space.

9. The liquid ejection head according to claim 8, wherein the communicating plate is a stacked body in which a plurality of plates are stacked and joined together with the adhesive agent, and an opening to constitute a part of the nozzle communicating port is formed in each of the plurality of plates.

10. A method of manufacturing an electronic device which includes a joined-structure assembly formed by joining a plurality of structures together, in which at least one of the plurality of structures includes a movable region, and a part of a liquid adhesive agent applied between the structures faces, a space communicating with the movable region, the method comprising:
applying the liquid adhesive agent to a transfer sheet, the adhesive agent including an organo-siloxane compound with three or more chains extending from a backbone, providing three or more reaction points for cross-linking the organo-siloxane compound;
increasing a viscosity of the liquid adhesive agent by incompletely curing the liquid adhesive agent applied to the transfer sheet; and
transferring the liquid adhesive agent to a surface of one of the structures in each joint pair.

11. The method of manufacturing an electronic device according to claim 10, wherein
the liquid adhesive agent is an addition-type silicone resin, and
the increasing of a viscosity is performed by a heat treatment.

12. The method of manufacturing an electronic device according to claim 11, further comprising curing the liquid adhesive agent by a heat treatment after the transferring of the adhesive agent.

13. The electronic device according to claim 2, wherein the adhesive agent includes an oxetanyl group.

14. The electronic device according to claim 2, wherein the adhesive agent is an organo-siloxane compound with an isocyanurate group in the backbone thereof, and where one of the three or more chains includes an epoxy group.

15. The electronic device according to claim 1, wherein the heterocyclic group in the backbone comprises an isocyanurate, an imidazole, a pyrazole, a pyrazine, a 1,3,5-triazine, a benzimidazole, or a benzofuran.

* * * * *